US008417503B2

(12) United States Patent
Bernstein et al.

(10) Patent No.: US 8,417,503 B2
(45) Date of Patent: Apr. 9, 2013

(54) SYSTEM AND METHOD FOR TARGET-BASED COMPACT MODELING

(75) Inventors: Kerry Bernstein, Underhill, VT (US); Josef S. Watts, South Burlington, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 1743 days.

(21) Appl. No.: 10/023,235

(22) Filed: Dec. 17, 2001

(65) Prior Publication Data

US 2003/0114944 A1 Jun. 19, 2003

(51) Int. Cl.
*G06F 17/50* (2006.01)
*G06F 9/455* (2006.01)
*G06F 11/30* (2006.01)
*G06F 19/00* (2011.01)

(52) U.S. Cl.
USPC ............. 703/14; 716/54; 716/56; 716/132; 700/97; 702/182

(58) Field of Classification Search ............ 703/13, 703/14
See application file for complete search history.

(56) References Cited

U.S. PATENT DOCUMENTS

| | | | | |
|---|---|---|---|---|
| 5,282,128 A * | 1/1994 | Braude | ........................... | 700/28 |
| 5,319,564 A * | 6/1994 | Smayling et al. | ................ | 703/13 |
| 5,438,527 A | 8/1995 | Feldbaumer et al. | | |
| 5,646,870 A * | 7/1997 | Krivokapic et al. | ............ | 703/13 |
| 5,655,110 A * | 8/1997 | Krivokapic et al. | ............ | 703/13 |
| 5,819,208 A * | 10/1998 | Carter | ............................. | 714/29 |
| 5,835,891 A * | 11/1998 | Stoneking | ..................... | 702/117 |
| 5,966,527 A * | 10/1999 | Krivokapic et al. | ............ | 703/14 |
| 6,028,994 A * | 2/2000 | Peng et al. | ....................... | 703/15 |
| 6,249,712 B1 * | 6/2001 | Boiquaye | ........................ | 700/31 |
| 6,269,277 B1 * | 7/2001 | Hershenson et al. | ........... | 700/97 |
| 6,298,470 B1 * | 10/2001 | Breiner et al. | ..................... | 716/4 |
| 6,311,096 B1 * | 10/2001 | Saxena et al. | .................. | 700/121 |
| 6,407,611 B1 * | 6/2002 | Larsen et al. | ................. | 327/362 |
| 6,598,210 B2 * | 7/2003 | Miwa | .............................. | 716/4 |
| 6,795,952 B1 * | 9/2004 | Stine et al. | ........................ | 716/4 |
| 6,850,877 B1 * | 2/2005 | Sengupta | ........................ | 703/14 |
| 7,076,415 B1 * | 7/2006 | Demler et al. | .................. | 703/14 |
| 2002/0059339 A1 * | 5/2002 | McCormick et al. | ...... | 707/500.1 |
| 2003/0114944 A1 * | 6/2003 | Bernstein et al. | ............... | 700/97 |
| 2008/0022239 A1 * | 1/2008 | McConaghy et al. | ........... | 716/4 |
| 2011/0093242 A1 * | 4/2011 | Lu | .................................. | 703/14 |
| 2011/0219348 A1 * | 9/2011 | Liu | ............................... | 716/132 |

OTHER PUBLICATIONS

Automated Evaluation of Critical Features in VLSI Layouts Based on Photolithographic Simualtion ; C Sengupta et al; IEEE 1997.*
CMOS Operational Aplifier Design and Optimization via Geometric Programming; Maria del Mar Hershenson et al; Power Point presentation, Stanford University, 28$^{th}$ Jul. 1997.*

* cited by examiner

*Primary Examiner* — Omar Fernandez Rivas
*Assistant Examiner* — Akash Saxena
(74) *Attorney, Agent, or Firm* — Gibb & Riley, LLC; Richard M. Kotulak, Esq.

(57) ABSTRACT

A method and structure for a computer model of a device has a performance parameter. The performance parameter includes a first bounded range and a second bounded range. The first bounded range has performance parameter variations within a single manufacturing process, and the second bounded range has performance parameter variations of different device designs.

38 Claims, 4 Drawing Sheets

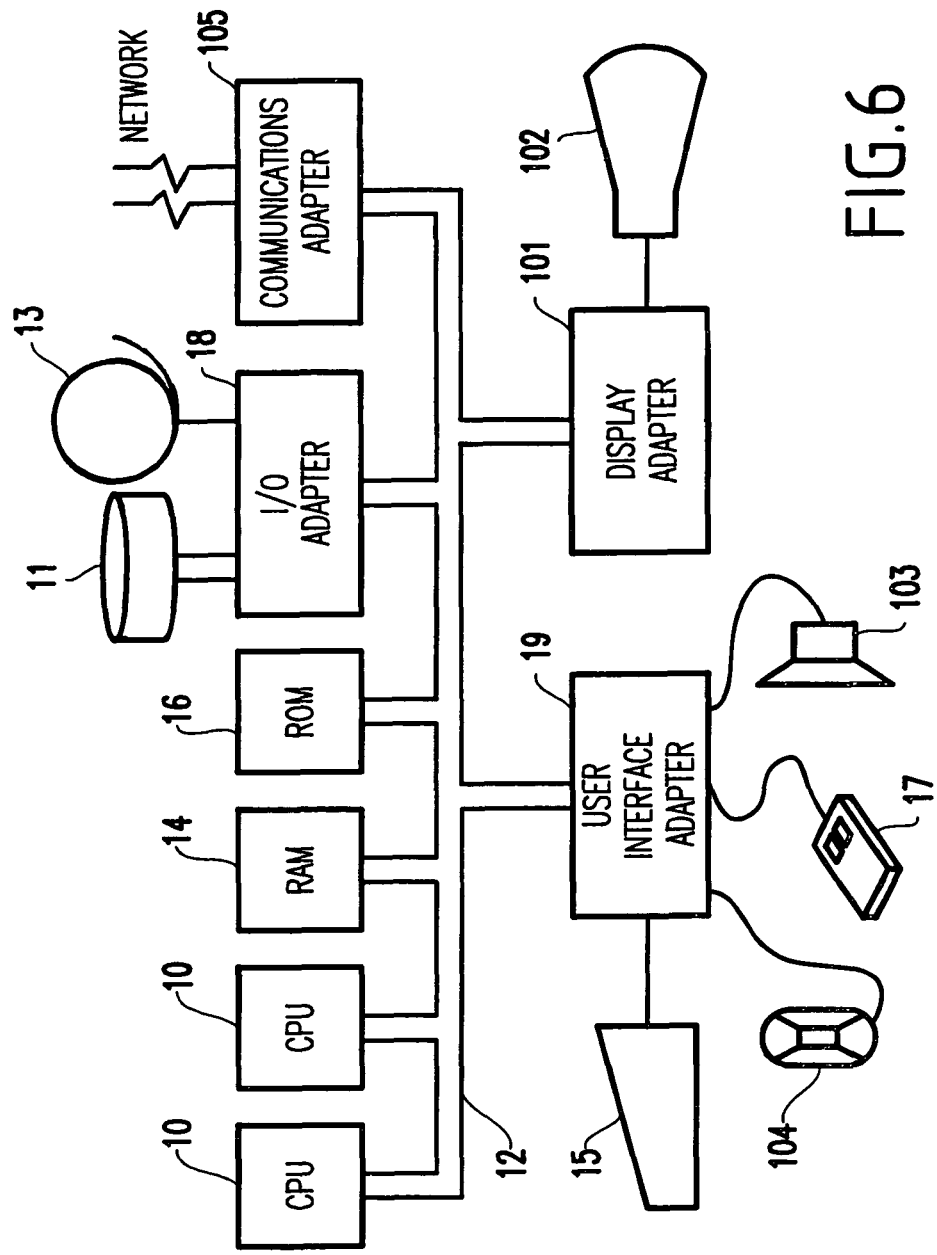

SYSTEM AND METHOD FOR TARGET-BASED COMPACT MODELING

BACKGROUND OF THE INVENTION

1. Field of the Invention

The present invention generally relates to device modeling and to an improved system of maintaining the target performance of the model through the development of the process used to fabricate the device.

2. Description of the Related Art

Today's fast-paced product development cycles necessitate that design tools such as compact models (e.g., the physics-based subroutines used in numerical simulation codes for larger entities such as circuits, mechanical systems, etc.) be developed early in the fabrication process development cycle. To create accurate compact models, large volumes of measured data taken from hardware that is fully representative of the next-generation process are needed. However, the largest available source of data is the current fabrication process technology generation. The amount of data available regarding the final version of the next-generation process is typically very small, since the next-generation process at the time of the compact model development is estimated from current fabrication capability. As more is learned about how the initial process description will perform, adjustments are made to maintain process goals, and the process evolves to its final state.

This process uncertainty presents a challenge for the developers of compact models. To cope with this situation, developers of compact models extrapolate from existing compact models, but include best estimates of parametrics for the next-generation process. If the initial process assumptions change as the process matures, a new model must be generated. Multiple model versions represent a concern for product designers, since this may potentially require a redesign if major model updates occur. Therefore, there is a need for a new method/system that maintains target performance parameters as the design of the process progresses. This invention addresses the problem of early compact model uncertainty due to process maturation by providing the product designer with the ability to assess design point variations while still maintaining the minimum overall performance targets for the nominal process.

SUMMARY OF THE INVENTION

In view of the foregoing and other problems, disadvantages, and drawbacks of the conventional modeling systems, the present invention has been devised, and it is an object of the present invention to provide a structure and method for an improved modeling system.

In order to attain the object(s) suggested above, there is provided, according to one aspect of the invention, a computer model (or target model, a model that is intended to be predictive of the final process performance) of a device that has a performance parameter. The performance parameter includes a first bounded range and a second bounded range. The first bounded range has performance parameter variations within a single manufacturing process. The second bounded range has performance parameter variations due to different device designs. In one embodiment of the invention, the first bounded range and the second bounded range are implemented as independent variations with separate properties. In a second embodiment, the first bounded range is within the second bounded range, that is the design variation is specified to include some limited process variation. The second bounded range has a plurality of performance points. Thus, in the invention, the performance parameter is at least a two-dimensional range of a plurality of performance points (of the first bounded range and/or the second bounded range).

The invention also includes a computer-implemented method for designing a product tolerant to variance in a given performance parameter. The method designs the product using a computer model. The performance parameter includes a first bounded range and a second bounded range. The first bounded range has performance parameter variations within a single manufacturing process. The second bounded range has performance parameter variations of different device designs.

The invention develops a product that has a plurality of devices. The invention also provides design goals. The invention then produces a target model of a device for the final product based on the design goals. The target model includes target performance parameters. The invention simultaneously designs the device and the final product based on the target performance parameters.

BRIEF DESCRIPTION OF THE DRAWINGS

The foregoing and other objects, aspects and advantages will be better understood from the following detailed description of a preferred embodiment(s) of the invention with reference to the drawings, in which:

FIG. 6 is a hardware embodiment in which the invention could operate.

DETAILED DESCRIPTION OF PREFERRED EMBODIMENTS OF THE INVENTION

Figure 1:
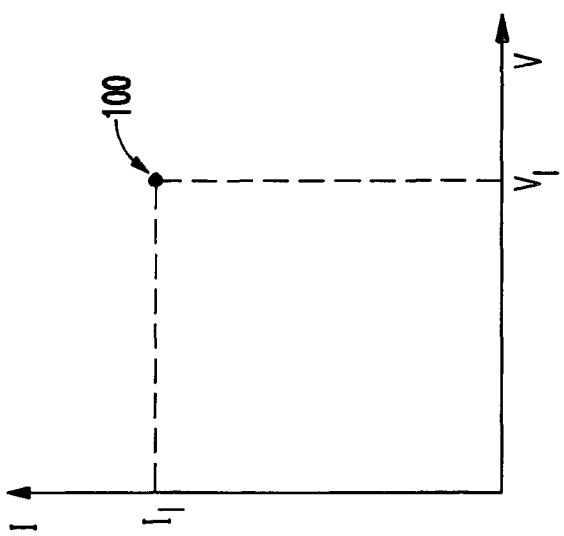
FIG. 1 is a chart showing current verses voltage for a device at a single performance point.

In the description to follow, reference will be made to "devices" and "products". In the preferred embodiment, "device" refers to an active or passive integrated circuit component, such as a transistor, capacitor, resistor, or the like (most preferably, it refers to a transistor), and "product" refers to the overall integrated circuit chip. However, it is to be understood that the invention is also applicable to any component of any product, where the performance attributes of that component help determine the functionality of the integrated product. Examples include chemical components and subcomponents of a drug, or the insole of a shoe, or the foam insulation of a hot tub. In each example, the former is the "device" and the latter is the "product".

The invention is applicable to situations in which the performance attributes of the device are in turn dependent on the manufacturing process by which it is made. That is, the manufacturing process can be developed to optimize certain "performance parameters" of the device. In our examples, a "performance parameter" could be the currant-voltage switchpoint of a transistor; the solubility of a component of a drug; the rigidity of an insole; or the coefficient of thermal expansion of foam insulation for a hot tub.

In designing the device, various tradeoffs are often made to optimize certain characteristics to optimize revenue. It might be to drive down cost, or maximize performance, or increase reliabililty, all as a function of the intended marketplace niche for the device. In business terms, the device will typically be targeted at a particular cost/performance point. Thus, in the parlance of this application, the "design" of the device can vary as a function of the cost/performance tradeoffs, or other marketplace factors a designer may wish to optimize for a given device. Alternatively, a design can be targeted to a single set of characteristics, but because of cost considerations, etc., such characteristics may not be realized when the device is manufactured.

In the invention, rather than specifying the performance parameter as a single point, the parameter is expressed in terms of its permitted variability within a range constrained by at least two variables. The first variable is expected variations in the manufacturing process itself, and the second variable is the variation in device design. For example, considering the insole of a shoe, rigidity (the "performance parameter") might vary as a function of the percentage of a given plastic. That percentage might be, e.g., 5% of the insole material. Normal process variations might be ±0.05%. However, for a different device design (e.g., to increase rigidity), the percentage might be 10%, and at that higher concentration the manufacturing variation might be ±0.04%. The invention expresses a performance parameter (rigidity) as varying as a function of expected variations within a given manufacturing process (±0.05% or ±0.04%) and varying as a function of device design (plastic concentrations between 5% and 10%), respectively.

The invention will now be discussed in more detail below, with reference to a preferred embodiment (i.e., semiconductor manufacture and transistor design).

With the invention, at the beginning of a new process technology (e.g., a new ULSI chip fabrication process generation), a compact model (the target model) is created for a device such as a metal-oxide semiconductor field-effect transistor (MOSFET) that reflects the process performance targets that are to be achieved at the end of the process development cycle. The model is typically based on extrapolation using an existing compact model from a previous process technology.

There are a number of different individuals or different teams that are involved in the design/manufacture of a final product. For example, when designing integrated circuits, a process designer is responsible for designing and manufacturing specific implants or dielectric layers. A device designer (e.g., transistor developer) uses the components designed/manufactured by the process developer to create individual devices (transistors). A circuit designer utilizes the different devices designed/manufactured by the transistor developer to create complete integrated circuits.

Figure 2:
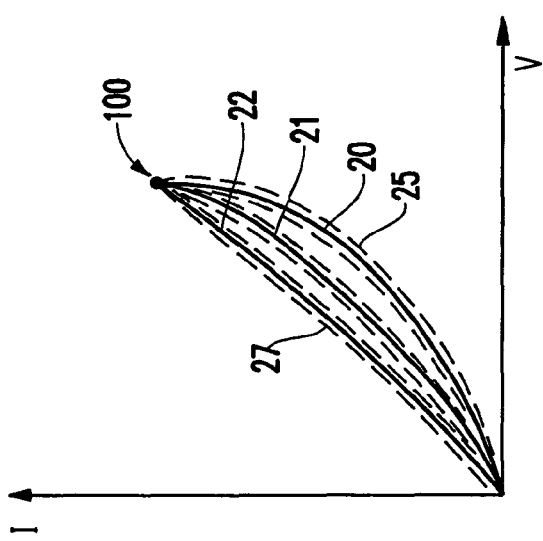
FIG. 2 is a chart showing different current-voltage trajectories that different device designs exhibit prior to reaching the single performance point shown in FIG. 1.
Figure 3:
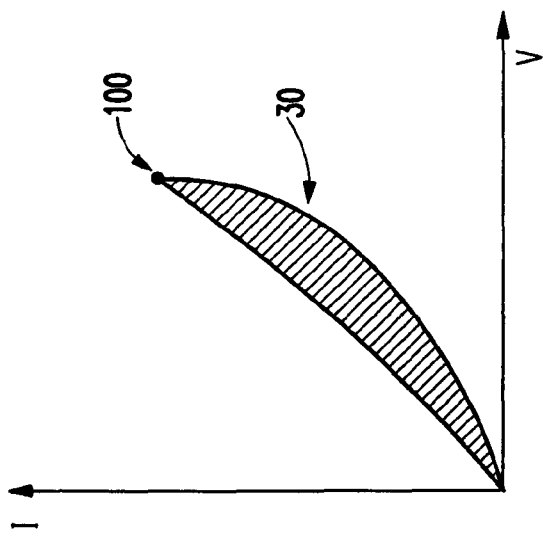
FIG. 3 is a chart showing the range of performance points associated with the different curves shown in FIG. 2.

FIGS. 1-3 are graphs which show current (I) verses voltage (V) of a device (e.g., a transistor). FIG. 1 illustrates a single target performance point 100. This indicates that, at a specific current ($I_1$), a specific voltage ($V_1$) will be output by the device (or vice versa). This is the traditional information that the device designer supplies to the circuit designer. Conventionally, a device designer would enter into an agreement (oftentimes a contractual agreement) to enable a specific circuit design (based on a model) to achieve a specific target performance point.

However, problems can occur as the design of the device progresses. For example, as shown in FIG. 2, three different devices can achieve the performance point 100 in different manners as represented by curves 20-22. Curves 22 is the most linear relationship between current and voltage while curves 20 is the least linear (and most exponential) current-voltage relationship. Each of the devices that produced curves 20-22 were based upon the same target model. However, because of individual design choices, cost consideration, etc., the final design of the devices was each slightly different, thus resulting in the different curves 20-22.

The inventors realized that this presents a potential problem to the circuit designer. For example, the circuit designer may design a circuit that included a large number of the devices that produced the curve 20. Yet in actuality, because of yield problems, cost considerations, etc., the device designer may create a device with a current-voltage curve more similar to curve 22.

In many instances, this difference could cause substantial problems (e.g., timing, power consumption, etc.) for the circuit being designed by the circuit designer. These problems are compounded because the circuit designer and device designer generally preparing their designs simultaneously (and sometimes independently) which prevents any problem from being detected until late in both design cycles. When the problem must be corrected, either the circuit designer or the device designer must perform a substantial amount of redesign, which is inefficient and expensive.

The invention solves this problem by producing a range of target performance parameters 30 as shown in FIG. 3. The range of target performance parameters 30 includes the points between the most linear curve 22 and the least linear curve 20. In the graphical representation shown in FIG. 3, the range of target performance parameters 30 is represented by a two-dimensional area. However, as would be known by one ordinarily skilled in the art, different variables could be included to form a multidimensional area of target performance parameters.

The range of target performance parameters 30 is increased by the manufacturing processing window. The manufacturing processing windows for each of the curves 20-22 are shown as the dashed lines 25, 27 surrounding each of the curves 20-22. Manufacturing process windows occur because of slight variations within manufacturing lines. For example, variables such as the temperature, pressure, processing time, chemical concentrations, etc., of various fixed manufacturing processes cannot be controlled with exact precision. Therefore, such variables can be somewhat inconsistent between different batches of products manufactured, even when using the same methodology on the same processing line. These inconsistencies are even more likely as different manufacturing lines are used to produce the same device.

Thus, in the examples shown FIG. 2, some of the devices may exhibit a slightly more linear or slightly less linear current-voltage curve than the theoretically perfect current-voltage curve for a given device design. For this reason, FIG. 2 illustrates the dashed manufacturing process window lines 25, 27 surrounding each of the curves 20-22. Further, since the designer must consider both manufacturing process variation and design variation, the range of performance parameters 30 includes the parameter points between the upper manufacturing process window 27 of curve 22 and the lower manufacturing process window 25 of curve 20, as shown in FIG. 2 in one embodiment of the invention.

By supplying a range of target performance parameters 30 to both the device designer and the circuit designer at an early stage in the design process, the invention substantially increases the probability that the final device design will operate as intended within the circuit design. Therefore, the device designer is provided the latitude to change the device design in any way necessary to achieve the various cost, yield, etc., goals that the device designer may have, so long as the device operates within the target performance parameter range 30. Similarly, the circuit designer is prevented from presuming that the device will perform outside the target performance parameters 30.

Figure 4:
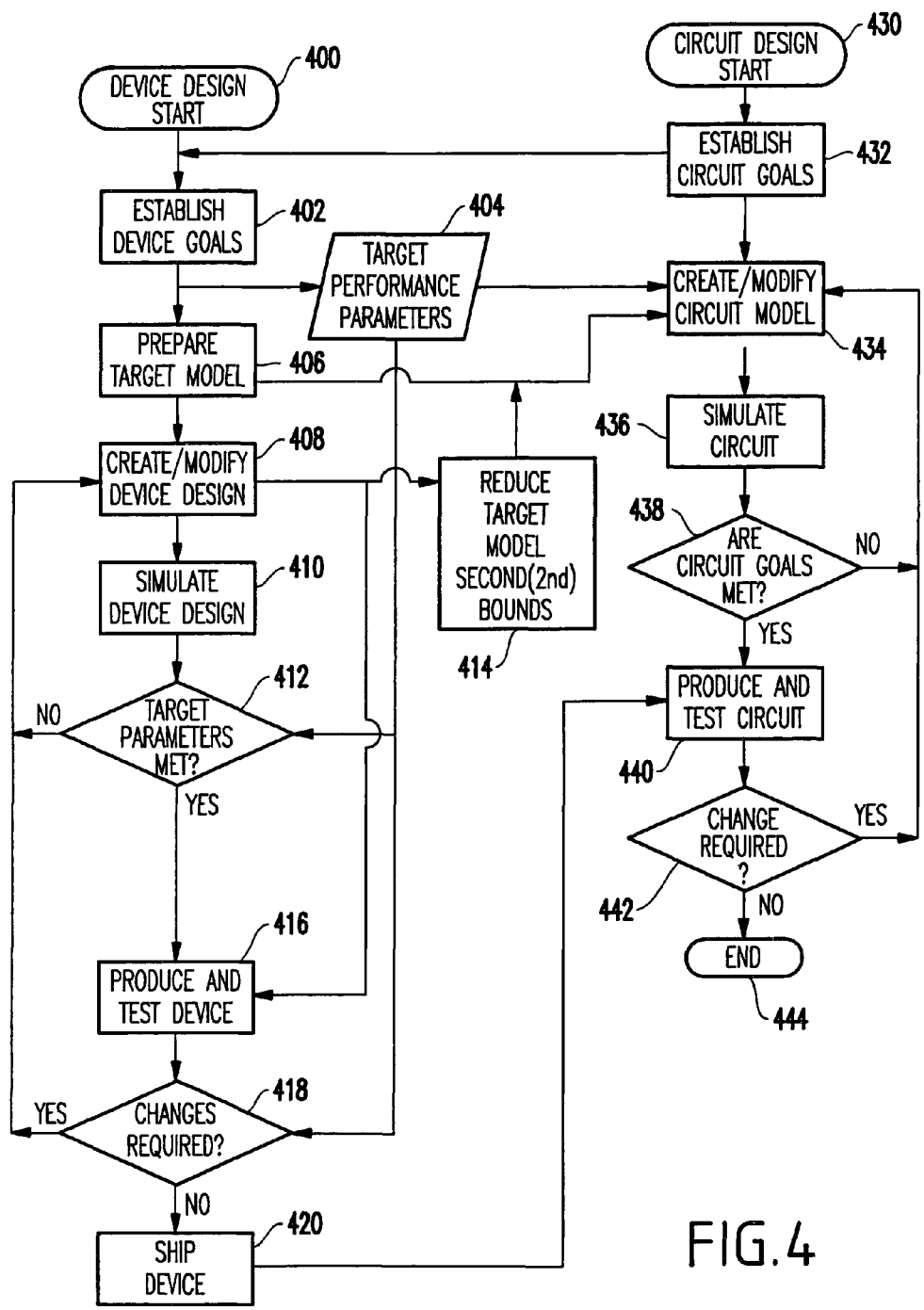
FIG. 4 is a flowchart illustrating a preferred method of the invention.

The simultaneous (parallel) development processes of the device designer and circuit designer are shown in FIG. 4. More specifically, the device design starts at item 400 and the circuit design process starts at item 430. Device goals are established in item 402 and are based, at least in part, upon the circuit goals developed in item 432. At this point, the device goals are merely conceptual objectives that the device should achieve, and do not represent a true model of the device. From these goals, the target performance parameters 404 are developed.

These performance parameter ranges 404 can be broad or narrow and are determined by actual testing of existing hardware, extrapolations, simulations, etc. Such target parameter ranges can include the various delays that the different elements may exhibit, the different currents that can be seen at different points within the circuit design, the capacitance of the various features, the different threshold voltages of the various circuit features, as well as current, voltage, and capacitance ratios. Specifically, target performance parameters can be developed from several methods including adjustments to an existing hardware-calibrated compact model that is constructed using a physical and scalable equation set. Other sources of information for developing target performance parameters include prototype hardware experiments and numerical simulations that are more detailed than compact models (the distinction "compact" means that the model equations described in this invention are distilled from more macroscopic forms of simulation into higher-level circuit elements such as capacitors, current sources, etc.). For example, as is known in the art, numerical finite-element simulation codes such as PISCES, FIELDAY, or DAMOCLES can be used to predictively examine possible device designs based on a spatially-discretized physical model of a transistor and adjusted physical and process assumptions.

A target model of the device is created using the target performance parameters and the device goals in item 406. The target model is constructed with as much attention to accuracy as possible, given the available information, since it must be predictive of both process and device design variations, and of the final nominal process. Once a target model is completed, it is then made available to circuit designers since the circuit design can not formally proceed without some type of compact model. The process development group(s) then simultaneously begin the ongoing cycle of refining their target specifications and device design in item 408. Optionally, simulation experiments from a number of sources including circuit analysis using the present target model are used to update the device design in items 410 and 412. Item 412 checks to see whether the target parameters (in item 404) have been met in the simulation 410. If the simulations indicate that the targets are not met, processing returns to item 408 where the device design is modified. In item 416, hardware experiments are used to produce and test new device designs. Hardware experiments include, but are not limited to, test chips that are composed of large arrays of individual transistors. Item 412 checks to see whether the target parameters (in item 404) have been met. If they have not been met, processing returns to item 408 where the device design is reviewed and updated. Note also that, as the process matures, the uncertainty in the target model's prediction of the final process can be reduced, and these updates are conveyed to the circuit designer community in item 414. This updated target model can be utilized by design groups that start their designs at times later than the availability date of the initial target model. From the circuit designer's perspective, the nominal performance point stays the same as the target model bounds tighten over time (e.g., the "$2^{nd}$" bounds in item 414). When it is determined that the device does not require further changes, item 420 represents the final device design which is supplied to the circuit designers.

The circuit design process relies upon the target performance parameters 404 and target model 406 to create a circuit model 434 of the chip. This circuit model is then simulated in item 436 and the results of the simulation are checked to determine whether the circuit goals have been met (438). If the circuit goals have not been met, processing returns to item 434 and the circuit is further modified. If the circuit goals have been met, the circuit is physically produced and tested 440 using the devices from item 420. In item 442, the invention checks as to whether the final circuit performs its intended function. If it does not, it is further modified in item 434 and the above processing is repeated.

The invention is conceptually different than the conventional modeling systems that supply a model that reflects a single performance point as in FIG. 1. As shown above, such a conventional system may cause a device, designed according to the compact model, to not perform as a circuit designer presumed it would. Rather, the invention supplies ranges of performance targets to both the device designer and the circuit designer. Therefore, while the conventional systems only supply a single parameter for each parametric, the invention supplies a range of parameters for each parametric. For purposes of this application, a "parametric" represents some specific performance feature of the device, such as the current-voltage performance, and "parameters" represent the different values that the device may produce for a given parametric (FIGS. 1-3).

By relying upon the target performance parametrics and device design distributions, this invention provides the circuit designer with a multiplicity of possible future design points. This allows the circuit designer to verify that their design works over the entire allowable device design window. This invention also provides the device designer with more flexibility to evaluate yield/cost/etc tradeoffs by permitting the device designer to alter the design, so long as the device complies with the target performance parameters.

The inventive target-based compact model allows designers to evaluate variations in the process while maintaining the performance targets set out by the target model. In other words, the invention allows the designer to examine how potential transistor design changes will influence representative circuits, while still maintaining the performance targets. The invention achieves this goal by correlating physical feature changes with target performance parameter changes. This process is shown in FIG. 5.

Figure 5:
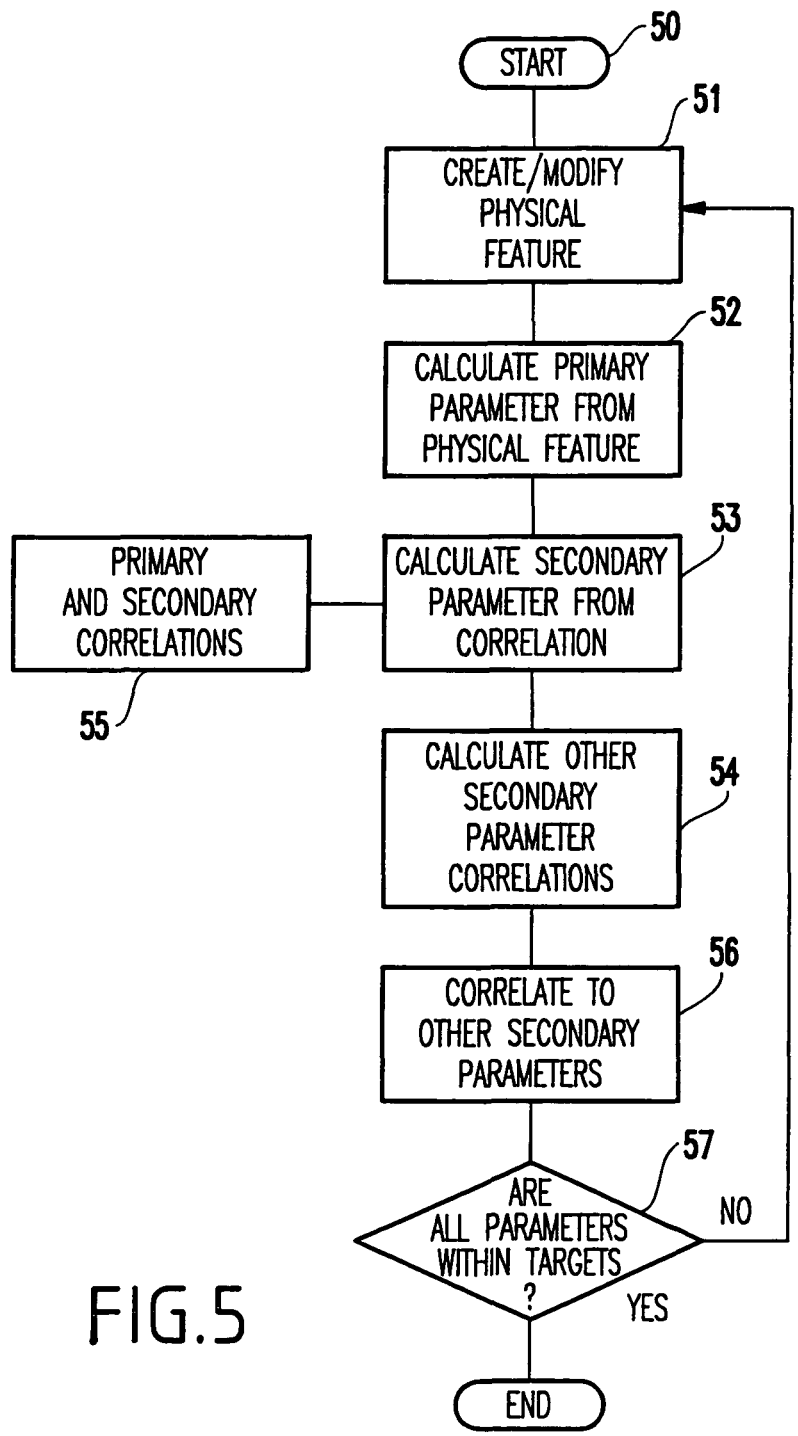
FIG. 5 is a flowchart illustrating the correlation of primary and secondary performance parameters achieved with the invention.

More specifically, the process in FIG. 5 starts in item 50. In item 51, a potential modification to the device design (addition or modification) can be proposed by the device designer. Next, in item 52, the invention calculates "primary device parameters" from such physical features. For purposes of this application, "primary device parameters" are performance characteristics that are directly related to the specific physical feature. For example, in MOSFET designs, the overlap capacitance ($C_{ov}$) is directly related to the length of the physical overlap of the gate material over the diffusion and extension (or lightly-doped drain) implants and the gate oxide thickness. Therefore, if the gate oxide thickness is increased 20%, the overlap capacitance will decrease by 10%, for example, the specific numbers depend on the exact device design. This is a well-known relationship to those ordinarily skilled in the art of semiconductor manufacturing. Similarly, the inversion capacitance ($C_{inv}$) is directly related to capacitive channel length. Therefore, if the capacitive channel length is increased 10%, the inversion capacitance will increase by 10%. This is also a well-known relationship to those ordinarily skilled in the art of semiconductor manufacturing.

There are a number of other primary device parameters and the foregoing is merely an example of two primary parameters associated with the field of integrated circuit transistors. The primary parameters will be different for different technologies. The important feature of the primary parameters is that they are directly related to physical features in the device and in most compact models, primary parameters do not depend on other parameters. The invention also provides a correlation between the primary parameters and "secondary parameters" (item 55 in FIG. 5). One secondary device parameter is total gate capacitance ($C_{gon}$) which is equal to the overlap capacitance (per side) to the inversion capacitance ($C_{gon}=C_{inv}+2\,C_{ov}$).

For purposes of this application, the distinction between a "primary parameter" and a "secondary parameter" is that the secondary parameter is calculated based upon one or more "primary parameters," while the primary parameters are directly calculated from physical features of the device. A secondary parameter demonstrates the performance of the device and is, therefore, useful as one of the target performance parameters mentioned above. These parameter classifications are in addition to certain other model parameters that are typically empirically set to establish the overall model fit. The secondary parameters are referred to herein as "constrained" or "derived," as opposed to the primary parameters that are "independent." The secondary parameters represent intermediate quantities that reflect the overall transistor's behavior. They are used by the process developer to adjust performance as the process matures. These performance targets comprise the acceptable range of operating parameters that the target model will exhibit. The invention stores the previously established calculations for the primary parameters and the correlations to the secondary parameters in easily accessible storage devices to allow automated calculation of the secondary parameters from physical design changes.

Finally, some secondary parameters have correlations among other secondary parameters. Examples of these correlated secondary parameters include circuit-level metrics such as beta ratio (the ratio of saturated N-type MOSFET current to saturated P-type MOSFET current) and inverter delay (the ratio of the quantity that is the product of power supply and certain capacitance terms to the saturated MOSFET current). Like the previously mentioned correlations, these correlation calculations are precomputed for fast access during a simulation run.

As shown in FIG. 5, the invention calculates the secondary parameter from the correlations (item 53). Since all secondary parameters are constrained, including secondary parameters that are correlated to other secondary parameters, the invention only produces model performance points within allowable limits. Items 54 and 56 modify certain secondary parameters that have correlations between other secondary parameters. The invention then checks to determine whether all secondary and primary parameters are within their corresponding target limits (item 57). If a parameter falls outside a limit, the method returns to item 51, so that the proposed design change can be removed, or so that a different or additional design change can be made.

This aspect of the invention allows the device designers to play "what if" scenarios on the device design. Therefore, if the device designer determines that a certain physical feature change may increase yield or decrease cost, that change can be evaluated using the processing shown in FIG. 5 to determine whether it would be acceptable and to maintain the target performance parameters required for the device. The features shown in FIG. 5 also allow a number features to be altered, thereby allowing balancing of different design choices to achieve some goal, yet maintain the devices performance within the range of target performance parameters. Thus, if a certain change in the physical design of the device causes a secondary device parameter to exceed the performance parameters, the invention allows the designer to change a different physical feature to see whether the performance can be brought back in line with the target performance parameters.

Stated another way, the invention provides "design distributions" that allow the designer to maintain the performance targets during development of the design. More specifically, design distributions include a set of statistical distributions that can be present in any of items 51-56, that reflect possible transistor design variations and a set of equations 53 and 56, that couple these equations in a compensating way such that transistor performance is preserved.

An important feature of the embodiment of the invention shown in FIG. 5, is that the evaluation process is fully automated. More specifically, the correlations shown in item 55 and certain coefficients, such as weighting factors, are established for each technology before implementing the invention within a given technology setting. Similarly, the calculations performed in items 53/56 to calculate the secondary parameters and the evaluations done in item 54 are easily accomplished using any conventionally available logical processing device (e.g., computer—FIG. 6). In the preferred embodiment, the design distributions are evaluated using Monte Carlo statistical analysis either separately or in addition to all of the manufacturing process distributions (normal compact model statistical behavior). If the design distributions are evaluated without process variation, the process variation is set at some fixed nominal (non-statistical) point. In this way, the performance point analysis loop in FIG. 5 is automated and a large selection of performance points can be evaluated on various multidimensional plots. By having such a system fully automated, the device designer's choices and actions are made much more efficient, thereby decreasing design time and cost.

The target model 406 is a set of equations (typically embodied in a set of software subroutines that are part of a circuit network simulation program) that includes some features that are new (associated with the next generation of technology) and some features that are old (associated with the current, or previous, generations of technology). Old features are typically the "shapes" of the curves. The overall behavior of the model is fairly well-defined by the equations used. In a scalable compact model, some parameters do not change in successive process generations. Therefore, the associated "second-order" primary parameters (e.g., certain fitting parameters) are usually not modified when a previous technology model is mapped into a new target model.

New features are typically the physical features that adjust the scalable model for the new process generation. The associated "first-order" primary parameters represent physical properties of the transistor that have been scaled. Examples include MOSFET gate oxide thickness, long-channel threshold, and diffusion-to-channel capacitance.

A representative hardware environment for practicing the present invention is depicted in FIG. 6, which illustrates a typical hardware configuration of an information handling/computer system in accordance with the subject invention, having at least one processor or central processing unit (CPU) 10. CPUs 10 are interconnected via system bus 12 to random access memory (RAM) 14, read-only memory (ROM) 16, an input/output (I/O) adapter 18 for connecting peripheral devices, such as disk units 11 and tape drives 13, to bus 12, user interface adapter 19 for connecting keyboard 15, mouse 17, speaker 103, microphone 104, and/or other user interface devices such as a touch screen device (not shown) to bus 12, communication adapter 105 for connecting the information handling system to a data processing network, and display adapter 101 for connecting bus 12 to display device 102. A program storage device readable by the disk or tape units, is used to load the instructions which operate on a compact modeling system which is also loaded onto the computer system.

An important feature of the invention is the fact that the hardware design that is created, based on the target model, maintains the performance targets throughout development (or at least minimum performance levels). Therefore, the device designers are constrained by the performance targets. By requiring that performance targets always be maintained, the invention reduces (or eliminates) the need for the circuit designer to alter their design to accommodate unanticipated functions of the devices.

During the device hardware design/maturation process, various proposed alterations to the hardware design will be made. These can include timing changes, physical shape changes, logical operations changes, etc. With the invention, the final hardware design that is produced maintains the operating parameter performance targets of the target model. The intent is that, as the process matures, the tolerances on the target model parameters (and the overall performance target(s) for the compact model) are reduced. In addition, the nominal point can be manually adjusted as more learning occurs (without reduction in performance).

Purely hardware-based models are only created for selected applications such as model-to-hardware correlation and product verification. In the general approach, there must be a way to provide a calibrated model for circuit designers to verify their designs. The hardware-based model provides that method of verification. However, because hardware produced in the middle of the process development cycle is usually not centered (i.e., it does not meet all process targets), the target model is still a better predictor of the final process.

The range within the various performance targets is conceptually different than the manufacturing process window. As shown above, manufacturing process windows are associated with the differences that can be expected between two devices produced in the same manufacturing line. During the manufacturing process, efforts are made to keep variables such as temperature, chemical concentration, processing time, etc., consistent for all manufacturing runs. However, despite the various efforts expended, some variations in the manufacturing process are to be expected. This produces items that are somewhat different. These differences represent the manufacturing process window.

To the contrary, in one embodiment, the inventive concept of performance targets is different than manufacturing process windows because the performance targets comprise limits beyond which the circuit design should not exceed. This includes performance that should be anticipated given all of the manufacturing process windows. Therefore, the invention takes into account the different manufacturing process windows and, even when considering such windows, produces performance that falls within the target parameters. Therefore, there are conceptually two bounded ranges associated with the invention. The first bounded range principally represents the manufacturing process windows, while the second bounded range represents the performance targets. Further, as shown in FIGS. 2 and 3, the manufacturing windows are always included within (are bounded within) the range of performance parameters in one embodiment of the invention. In another embodiment, manufacturing and design variations are simulated separately.

The compact model is scalable and physical. While individual process details may change, if there are valid process adjustments, the transistor designer will always maintain the same overall performance targets. The compact model can be adjusted in compensating ways to maintain fixed performance metrics.

While the invention has been described in terms of preferred embodiments, those skilled in the art will recognize that the invention can be practiced with modification within the spirit and scope of the appended claims.

What is claimed is:

1. A simulator comprising:
   a memory for storing a computer model of an integrated circuit comprising a device that comprises an integrated circuit component and that has a current-voltage performance attribute, wherein said computer model is generated based on a target model for said device and wherein said target model is created using a target performance parameter range for said current-voltage performance attribute and is adapted to predict process and design variations of said device; and
   a processor in communication with said memory and adapted to determine said target performance parameter range and to execute said computer model,
   wherein said target performance parameter range encompasses multiple first bounded ranges and a second bounded range,
   wherein said second bounded range is bounded by two of multiple different current-voltage model curves for multiple different designs for said device, said multiple different designs each achieving a same specific performance target comprising a same specific current-voltage point such that said different current-voltage model curves converge at said specific current-voltage point, and
   wherein each one of said first bounded ranges is bounded by an upper manufacturing process window current-voltage curve and a lower manufacturing process window current-voltage curve around a corresponding one said different current-voltage model curves and is indicative of manufacturing process variations, and
   wherein each one of said multiple different designs is directed to a variation of a single design for said integrated circuit.

2. The simulator in claim 1, wherein, when more than two different designs for said device achieve said specific performance target, said second bounded range is bounded by a most linear of said multiple different current-voltage model curves and a least linear of said multiple current-voltage model curves and wherein said target range is constrained by said upper manufacturing process window current-voltage curve associated with a first bounded range around said most linear of said multiple different current-voltage model curves and said lower manufacturing process window current-voltage curve associated with another first bounded range around said least linear of said multiple different current-voltage model curves.

3. The simulator in claim 1, wherein said target performance parameter range is the same for said target model of said device and a final hardware design of said device.

4. The simulator in claim 1, wherein said second bounded range and said multiple first bounded ranges are determined based on testing of existing hardware, extrapolations and simulations.

5. The simulator in claim 1, wherein said multiple different designs of said device are permitted to vary as long as target performance parameters are maintained within said target performance parameter range.

6. The simulator in claim 1, wherein said target performance parameter range comprises a plurality of performance points.

7. The simulator in claim 1, wherein said target performance parameter range comprises at least a two-dimensional range of a plurality of performance points.

8. A computer-implemented method for designing a product having a device comprising an integrated circuit component, wherein said product is tolerant to variance in a given target performance parameter for a given current-voltage performance attribute of said device, said method comprising:
designing said product using a computer model that is based on a target model of said device, wherein said target model is created using a target performance parameter range for said current-voltage performance attribute,
wherein said target performance parameter range encompasses multiple first bounded ranges and a second bounded range,
wherein said second bounded range is bounded by two of multiple different current-voltage model curves for multiple different designs for said device, said multiple different designs each achieving a same specific performance target comprising a specific current-voltage point such that said different current-voltage model curves converge at said specific current-voltage point,
wherein each one of said first bounded ranges is bounded by an upper manufacturing process window current-voltage curve and a lower manufacturing process window current-voltage curve around a corresponding one of said different current-voltage model curves and is indicative of manufacturing process variations, and
wherein each one of said multiple different designs is directed to a variation of a single design for said device.

9. The method of claim 8, wherein, when more than two different designs for said device achieve said specific performance target, said second bounded range is bounded by a most linear of said multiple different current-voltage model curves and a least linear of said multiple current-voltage model curves and wherein said target range is constrained by said upper manufacturing process window current-voltage curve associated with a first bounded range around said most linear of said multiple different current-voltage model curves and said lower manufacturing process window current-voltage curve associated with another first bounded range around said least linear of said multiple different current-voltage model curves.

10. The method of claim 8, wherein said target performance parameter range is the same for said target model of said device and a final hardware design of said device and wherein said second bounded range and said multiple first bounded ranges are determined based on testing of existing hardware, extrapolations and simulations.

11. The method in claim 8, wherein said multiple different designs of said device are permitted to vary within said model as long as said given target performance parameter remains within said target performance parameter range.

12. A method of developing a product comprising a device with at least one current-voltage performance attribute, wherein said device comprises an integrated circuit component, said method comprising:
developing device goals for said device, wherein said device goals are based on product goals;
developing a target performance parameter range for said current-voltage performance attribute based on said device goals,
wherein said target performance parameter range encompasses multiple first bounded ranges and a second bounded range,
wherein said second bounded range is bounded by two of multiple different current-voltage model curves for multiple different designs for said device, said multiple different designs each achieving a same specific performance target comprising a specific voltage at a specific current such that said different current-voltage model curves converge at said specific performance target, and
wherein each one of said first bounded ranges is bounded by an upper manufacturing process window current-voltage curve and a lower manufacturing process window current-voltage curve around a corresponding one said different current-voltage model curves and is indicative of manufacturing process variations, and,
wherein each of said multiple different designs is directed to a variation of a single design for said device,
producing a target model of said device based on said device goals and said target performance parameter range, wherein said target model is adapted to predict process and design variations of said device; and
designing said product with said device based on said target model.

13. The method of claim 12, wherein said target performance parameter range comprises a plurality of performance points.

14. The method of claim 12, wherein, when more than two different designs for said device achieve said specific performance target, said second bounded range is bounded by a most linear of said multiple different current-voltage model curves and a least linear of said multiple current-voltage model curves and wherein said target range is constrained by said upper manufacturing process window current-voltage curve associated with a first bounded range around said most linear of said multiple different current-voltage model curves and said lower manufacturing process window current-voltage curve associated with another first bounded range around said least linear of said multiple different current-voltage model curves.

15. The method of claim 12, wherein said target performance parameter range is the same for said target model of said device and a final hardware design of said device and wherein said second bounded range and said multiple first bounded ranges are determined based on testing of existing hardware, extrapolations and simulations.

16. The method in claim 12, wherein said multiple different designs are permitted to vary as long as target performance parameters are maintained within said target performance parameter range.

17. A method of designing a device with at least one current-voltage performance attribute, wherein said device comprises an integrated circuit component said method comprising:
- providing a target model for said device;
  - wherein said target model is created based on a target performance parameter range for said current-voltage performance attribute,
  - wherein said target performance parameter range encompasses multiple first bounded ranges and a second bounded range,
  - wherein said second bounded range is bounded by two of multiple different current-voltage model curves for multiple different designs for said device, said multiple different designs each achieving a same specific performance target comprising a specific voltage at a specific current such that said different current-voltage model curves converge at said specific performance target,
  - wherein each one of said first bounded ranges is bounded by an upper manufacturing process window current-voltage curve and a lower manufacturing process window current-voltage curve around a corresponding one said different current-voltage model curves and is indicative of manufacturing process variations, and,
  - wherein each of said multiple different designs is directed to a variation of a single design for said device, and
  - wherein said second bounded range and said multiple first bounded ranges are determined based on testing of existing hardware, extrapolations and simulations,
- developing a design for said device based on said target model;
- proposing a modification of said design, wherein said modification comprises one of adding a particular feature into said design and modifying said particular feature already in said design;
- determining primary parameters for said particular feature;
- determining secondary parameters from said primary parameters; and
- balancing design choices related to said modification and, particularly, to said primary parameters and said secondary parameters in order to maintain device performance within said said target performance parameter range.

18. The method of claim 17, wherein said step of determining secondary parameters further comprises the steps of:
- determining at least one further secondary parameter from said secondary parameters; and
- correlating said secondary parameters to said at least one further secondary parameter.

19. The method of claim 17, further comprising the step of verifying that all primary and secondary parameters are within allowable limits.

20. The method of claim 17, wherein said primary parameters comprise first-order primary parameters and second-order primary parameters.

21. The method of claim 17, wherein, when more than two different designs for said device achieve said specific performance target, said second bounded range is bounded by a most linear of said multiple different current-voltage model curves and a least linear of said multiple current-voltage model curves and wherein said target range is constrained by said upper manufacturing process window current-voltage curve associated with a first bounded range around said most linear of said multiple different current-voltage model curves and said lower manufacturing process window current-voltage curve associated with another first bounded range around said least linear of said multiple different current-voltage model curves.

22. A method of developing a product comprising a device with at least one current-voltage performance attribute, wherein said device comprises an integrated circuit component said method comprising:
- developing device goals for said device, wherein said device goals are based on product goals for said product;
- developing a target performance parameter range for said current-voltage performance attribute based on said device goals,
  - wherein said target performance parameter range encompasses multiple first bounded ranges and a second bounded range,
  - wherein said second bounded range is bounded by two of multiple different current-voltage model curves for multiple different designs for said device, said multiple different designs each achieving a same specific performance target comprising a specific voltage at a specific current such that said different current-voltage model curves converge at said specific performance target,
  - wherein each one of said first bounded ranges is bounded by an upper manufacturing process window current-voltage curve and a lower manufacturing process window current-voltage curve around a corresponding one said different current-voltage model curves and is indicative of manufacturing process variations, and,
  - wherein each of said multiple different designs is directed to a variation of a single design for said device;
- producing a target model of said device based on said device goals and said target performance parameter range, wherein said target model is adapted to predict process and design variations of said device;
- creating a computer model of said product, wherein said computer model of said product is based on said target model; and
- simulating said computer model of said product to determine whether said product goals have been met.

23. The method of claim 22, further comprising:
- altering a device design to produce an altered device design; and
- accepting said altered device design only if said altered device design performs within said target performance parameter range.

24. The method of claim 23, further comprising:
- refining said target model based on said altered device design; and
- designing at least said product based on said refined target model.

25. The method of claim 23, wherein said step of accepting said altered device design further comprises the steps of carrying out experiments on test chips.

26. The method of claim 22, wherein said step of designing said product further comprises:
- providing design goals for said product; and
- developing a product model from said target model and from said design goals for said product.

27. The method of claim 26, further comprising:
simulating said product model;
determining whether said design goals for said product have been met; and
altering said design of said product if said product design goals have been met.

28. The method of claim 23, wherein said accepting process comprises:
calculating a primary parameter from a physical device feature;
calculating a secondary parameter based on said primary parameter; and
comparing said secondary parameter to said target performance parameter.

29. The method of claim 28, further comprising correlating other secondary parameters from correlations to said secondary parameters.

30. The method of claim 28, wherein said primary parameter is directly related to said physical device feature.

31. The method of claim 28, wherein said calculating of said secondary parameter is performed using predetermined primary-to-secondary correlation calculations.

32. The method of claim 22, wherein said target performance parameters are the same for a target model of said device and a final hardware design of said device and wherein said second bounded range and said multiple first bounded ranges are determined based on testing of existing hardware, extrapolations and simulations.

33. The method of claim 22, wherein device design is permitted to vary as long as target performance parameters are maintained within said target performance parameter range.

34. A non-transitory program storage device readable by computer and tangibly embodying a model of an integrated circuit device that has at least one current-voltage performance attribute, said model, executable by said computer, comprising:
a set of subroutines created using a target performance parameter range for said current-voltage performance attribute, wherein said set of subroutines, when executed by said computer, predict process and design variations of said device,
wherein said target performance parameter range encompasses multiple first bounded ranges and a second bounded range, wherein said second bounded range is bounded by two of multiple different current-voltage model curves for multiple different designs for said device, said multiple different designs each achieving a same specific performance target comprising a specific voltage at a specific current such that said different current-voltage model curves converge at said specific performance target,
wherein each one of said first bounded ranges is bounded by an upper manufacturing process window current-voltage curve and a lower manufacturing process window current-voltage curve around a corresponding one said different current-voltage model curves and is indicative of manufacturing process variations, and
wherein each of said multiple different designs is directed to a variation of a single design for said device.

35. The program storage device in claim 34, wherein, when more than two different designs for said device achieve said specific performance target, said second bounded range is bounded by a most linear of said multiple different current-voltage model curves and a least linear of said multiple current-voltage model curves and wherein said target range is constrained by said upper manufacturing process window current-voltage curve associated with a first bounded range around said most linear of said multiple different current-voltage model curves and said lower manufacturing process window current-voltage curve associated with another first bounded range around said least linear of said multiple different current-voltage model curves.

36. The program storage device in claim 34, wherein said performance parameter comprises a plurality of performance points.

37. A non-transitory program storage device readable by computer and tangibly embodying a program of instructions executable by said computer to perform an integrated circuit development method, said method comprising:
producing a target model of a device for a product using a target performance parameter range for a current-voltage performance attribute of said device, wherein said device comprises an integrated circuit component and wherein said target model comprises a set of subroutines that are adapted to predict process and design variations of said device,
wherein said target performance parameter range encompasses multiple first bounded ranges and a second bounded range,
wherein said second bounded range is bounded by two of multiple different current-voltage model curves for multiple different designs for said device, said multiple different designs each achieving a same specific performance target comprising a specific voltage at a specific current such that said different current-voltage model curves converge at said specific performance target,
wherein each one of said first bounded ranges is bounded by an upper manufacturing process window current-voltage curve and a lower manufacturing process window current-voltage curve around a corresponding one said different current-voltage model curves and is indicative of manufacturing process variations, and
wherein each of said multiple different designs is direct to a variation of a single design for said device; and
creating a computer model of said product, wherein said computer model of said product is based on said target model.

38. A computer-implemented method of developing a product comprising a device with at least one current-voltage performance attribute, wherein said device comprises an integrated circuit component, said method comprising:
designing said product using a computer model that is based on a target model of said device, wherein said target model is created using a target performance parameter range for said current-voltage performance attribute,
wherein said target performance parameter range encompasses multiple first bounded ranges and a second bounded range,
wherein said second bounded range is bounded by a most linear of multiple different current-voltage model curves for multiple different designs for said device and a least linear of multiple different current-voltage model curves for said multiple different designs for said device,
wherein each of said multiple different current-voltage model curves achieves a same specific performance target comprising a specific voltage at a specific current such that said different current-voltage model curves converge at said specific performance target,
wherein each one of said first bounded ranges is bounded by an upper manufacturing process window current-voltage curve and a lower manufacturing process window current-voltage curve around a corresponding one said different current-voltage model curves, is indicative of manufacturing process variations and is determined based on actual testing of existing hardware, extrapolations and simulations, and, wherein each of said multiple different designs is directed to a variation of a single design for said device.

* * * * *